United States Patent [19]

Natsuhara et al.

[11] Patent Number: 5,602,720
[45] Date of Patent: Feb. 11, 1997

[54] MOUNTING STRUCTURE FOR SEMICONDUCTOR DEVICE HAVING LOW THERMAL RESISTANCE

[75] Inventors: Masuhiro Natsuhara; Harutoshi Ukegawa, both of Hyogo, Japan

[73] Assignee: Sumitomo Electric Industries, Ltd., Osaka, Japan

[21] Appl. No.: 264,329

[22] Filed: Jun. 23, 1994

[30]   Foreign Application Priority Data

Jun. 25, 1993  [JP]  Japan .................................. 5-179950

[51] Int. Cl.$^6$ ...................................................... H05K 7/20
[52] U.S. Cl. ........................ 361/708; 174/16.3; 257/711; 257/712; 361/808
[58] Field of Search ............................ 165/80.2, 80.3, 165/185; 174/16.3, 52.4; 257/703, 705–712, 731; 361/704–706, 707–710, 714–715, 717–718, 722, 807–812

[56]   References Cited

U.S. PATENT DOCUMENTS 3,439,255  4/1969  Carnes et al. ........................... 361/708
4,788,627  11/1988  Ehlert et al. ............................ 361/704

Primary Examiner—Gregory D. Thompson
Attorney, Agent, or Firm—Foley & Lardner

[57]   ABSTRACT

A structure for mounting a semiconductor device includes a ceramic plate having a thermal conductivity equal to or higher than 120 W/mK on one surface of which the semiconductor device is mounted, a heat sink joined to another surface of the ceramic plate formed of a copper or copper based alloy plate having a thermal conductivity equal to or higher than 300 W/mK, and a base member formed of a metal or an alloy having a thermal conductivity equal to or higher than 100 W/mK on which the heat sink is mounted.

11 Claims, 7 Drawing Sheets

MOUNTING STRUCTURE FOR SEMICONDUCTOR DEVICE HAVING LOW THERMAL RESISTANCE

BACKGROUND OF THE INVENTION

1. Field of the Invention

The present invention relates to a mounting structure for a semiconductor device, and more specifically to a mounting structure for a semiconductor device of high calorific power such as a high power transistor or a microwave monolithic IC (integrated circuit), which has low thermal resistance and high thermal conductivity.

2. Description of Related Art

Semiconductor devices have improved in their output power and operating speeds. In particular, semiconductor devices used for processing microwave signal generally have high output power and rapid operating speeds. These high output and rapid semiconductor devices generate much heat so that their operation properties may be lowered by overheating.

In order to prevent the overheating, the semiconductor device of high calorific power is mounted on a substrate of a material of high thermal conductivity. Namely, the substrate of low thermal resistance allows the heat generated by the semiconductor device to efficiently dissipate. For example, beryllia (BeO) having a high thermal conductivity is used for the substrate.

In case of using a beryllia substrate, both surfaces of the beryllia substrate are metalized and the beryllia substrate is brazed to a base member formed of copper or copper-tungsten alloy. A semiconductor device or devices are mounted on a surface of the beryllia substrate mounted in the base member.

Although beryllia has higher thermal conductivity than other ceramic materials used for the substrate, recently heat radiation of the above mounting structure utilizing beryllia has become insufficient for dissipating heat generated by the semiconductor device. In order to improve the heat radiation of the mounting structure, using a thinner beryllia substrate has been considered.

However, since beryllia is poisonous and has poor processability, it is difficult to thin the beryllia substrate. Thus, the heat radiation of the mounting structure utilizing beryllia substrate can not be improved by using a thinner beryllia substrate. In addition, materials having higher thermal conductivities than beryllia such as diamond and cubic boron nitride (c-BN) are too expensive for the mounting of the semiconductor device.

SUMMARY OF THE INVENTION

Accordingly, it is an object of the present invention to provide a mounting structure for a semiconductor device which has overcome the above mentioned defect of the conventional one.

Another object of the present invention is to provide a ceramic package for a semiconductor device having high heat radiation.

The above and other objects of the present invention are achieved in accordance with the present invention by a mounting structure for mounting a semiconductor device comprising a ceramic plate having a thermal conductivity equal to or higher than 120 W/mK on one surface of which the semiconductor device is mounted, a heat sink joined to another surface of the ceramic plate formed of a copper or copper based alloy plate having a thermal conductivity equal to or higher than 300 W/mK, and a base member foraged of a metal or an alloy having a thermal conductivity equal to or higher than 100 W/mK on which the heat sink is mounted.

The mounting structure in accordance with the present invention preferably comprises a second heat sink formed of a copper or copper based alloy plate having a thermal conductivity equal to or higher than 300 W/mK joined to the surface of the ceramic plate on which the semiconductor device is mounted.

In this case, the second heat sink may cover only a portion of the surface of the ceramic plate near the semiconductor device. It is also preferable that the second heat sink forms an electric circuit.

In the mounting structure according to the structure, the ceramic plate is preferably formed of aluminium nitride or beryllia. In addition, the base member is preferably formed of copper, a copper-tungsten alloy or a copper-molybdenum alloy.

According to another aspect of the present invention, there is provided a mounting structure for mounting a semiconductor device comprising a ceramic plate having a thermal conductivity equal to or higher than 120 W/mK on one surface of which the semiconductor device is mounted and a base member formed of a copper or copper based alloy plate having a thermal conductivity equal to or higher than 300 W/mK, on which the ceramic plate is mounted.

In addition, according to the present invention, there is provided a mounting structure for mounting a semiconductor device comprising a ceramic plate having a thermal conductivity equal to or higher than 120 W/mK on one surface of which the semiconductor device is mounted, a heat sink joined to another surface of the ceramic plate formed of a copper or copper based alloy plate having a thermal conductivity equal to or higher than 300 W/mK, and a base member formed of a metal or an alloy having a thermal conductivity equal to or higher than 100 W/mK on which the heat sink is mounted.

The above and other objects, features and advantages of the present invention will be apparent from the following description of preferred embodiments of the invention with reference to the accompanying drawings.

DESCRIPTION OF THE PREFERRED EMBODIMENTS

Figure 1A:
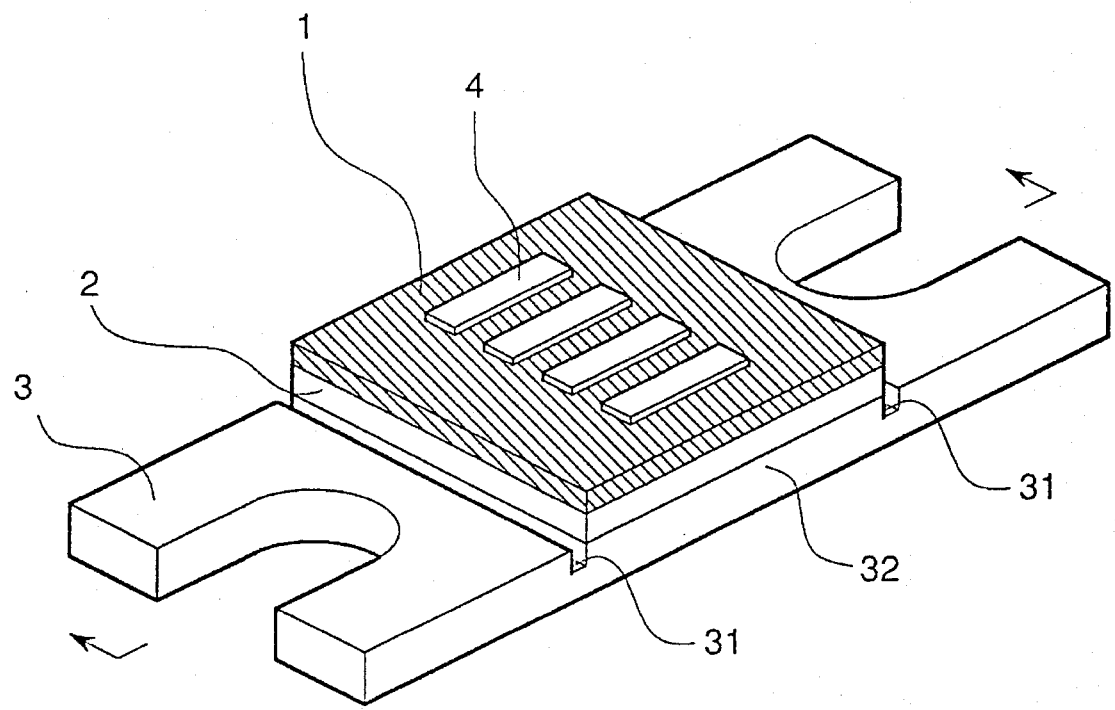
FIGS. 1A, 2A, 3A, 4A, 5A and 7A are perspective views of embodiments of the mounting structure in accordance with the present invention.
Figure 1B:
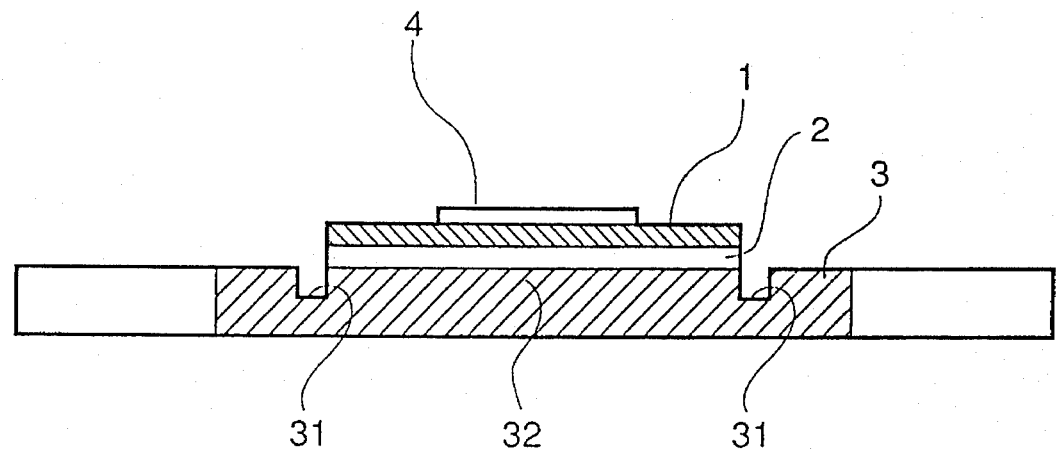
FIGS. 1B, 2B, 3B, 4B, 5B and 7B are sectional views taken on arrows of FIGS. 1A, 2A, 3A, 4A, 5A and 7A.

Referring to FIGS. 1A and 1B, a first embodiment of the mounting structure for a semiconductor device in accordance with the present invention will be explained. The mounting structure shown in FIGS. 1A and 1B comprises a base 3 foraged of a copper-tungsten alloy having two grooves 31 which form a rectangle or a square island portion 32 at a center of the base 3, a heat sink 2 formed of a copper plate disposed on the island portion 32, and a ceramic plate 1 formed of aluminium nitride disposed on the heat sink 2, on which four semiconductor devices 4 are mounted.

Though they are not shown in FIGS. 1A and 1B, wirings for the semiconductor devices can be arbitrarily performed. For example, a printed circuit may be formed on the ceramic plate 1, terminals which are electrically connected to the semiconductor devices 4 by metal wires can be arranged on the ceramic plate 1 or base 3, or an appropriate cap (not shown) having terminals which are electrically connected to the semiconductor devices 4 may be arranged on the base 3.

The base 3 has a dimension of 12×28 millimeters and a thickness of 1.5 millimeters excluding the groove portions. Both ends of the base 3 are cut so as to form U-shape notches for screws by which the base is fixed on a printed-circuit board or the like. In this embodiment, the base 3 is formed of a copper-tungsten alloy. However, the base can also be formed of a metal or an alloy having a thermal conductivity equal to or higher than 100 W/mK, for example copper or a copper-molybdenum alloy other than the copper-tungsten alloy. If thermal conductivity of the base is lower than 100 W/mK, thermal resistance of the mounting structure can not be too low.

The heat sink 2 has a dimension of 10×10 millimeters and a thickness of 0.35 millimeters. The heat sink 2 can be formed of copper or a copper based alloy having a thermal conductivity equal to or higher than 300 W/mK. If the thermal conductivity is lower than 300 W/mK, thermal resistance of the mounting structure can not be too low.

The ceramic plate 1 has a dimension of 10×10 millimeters and a thickness of 0.25 millimeters. In this embodiment, the ceramic plate 1 is formed of aluminium nitride having a thermal conductivity of on the order of 180 W/mK. The ceramic plate 1 can be formed of a ceramic having a thermal conductivity equal to or higher than 120 W/mK, for example, silicon carbide having a thermal conductivity of on the order of 270 W/mK and beryllia having a thermal conductivity of 220 to 280 W/mK. The ceramic plate I isolates the semiconductor devices 4.

Figure 2A:
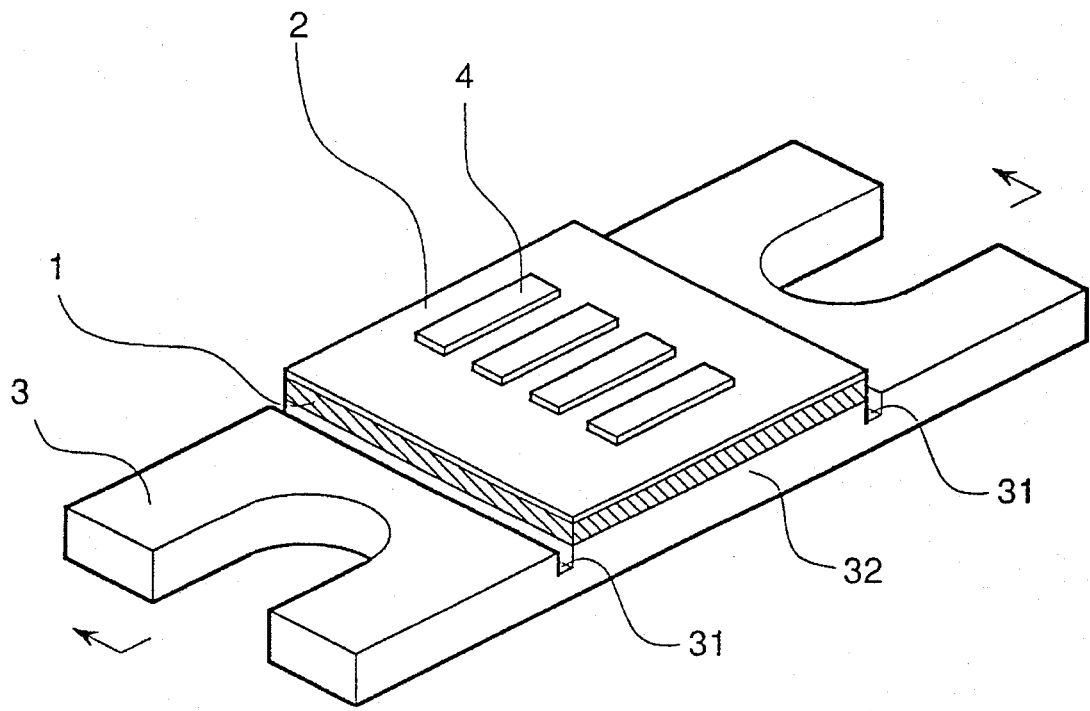
Figure 2B:
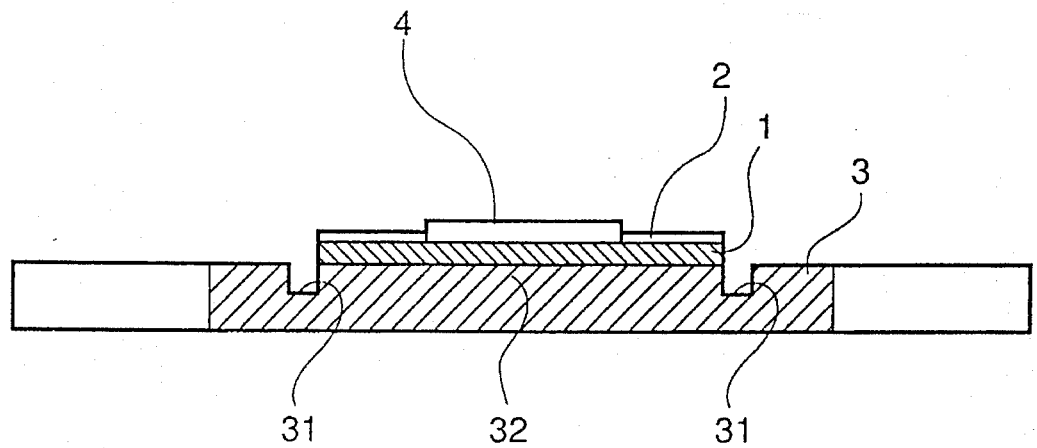

Referring to FIGS. 2A and 2B, a second embodiment of the mounting structure for a semiconductor device in accordance with the present invention will be explained. The mounting structure shown in FIGS. 2A and 2B comprises a base 3 equal to that of FIGS. 1A and 1B, a ceramic plate 1 equal to that of FIGS. 1A and 1B disposed on the island portion 32 of the base 3, and a heat sink 2 formed of a copper plate covering the ceramic plate 1 excluding semiconductor devices 4. Namely, the mounting structure of this embodiment is different from that of FIGS. 1A and 1B in that the heat sink 2 is arranged on an upper surface of the ceramic plate 1 on which the semiconductor devices 4 are mounted instead of between the ceramic plate 1 and base 3.

In this embodiment, the ceramic plate 1 has a dimension of 10×10 millimeters and a thickness of 0.4 millimeters and the heat sink 2 has a dimension of 10×10 millimeters and a thickness of 0.2 millimeters. The heat sink 2 has openings through which the semiconductor devices 4 are exposed.

The heat sink 2 can be formed of copper or a copper based alloy having a thermal conductivity equal to or higher than 300 W/mK. If the thermal conductivity is lower than 300 W/mK, thermal resistance of the mounting structure can not be too low.

Since the heat sink 2 is arranged on the upper surface the ceramic plate 1 on which the semiconductor devices 4 are mounted, the mounting structure shown in FIGS. 2A and 2B has lower thermal resistance than that of the mounting structure shown in FIGS. 1A and 1B.

Figure 3A:
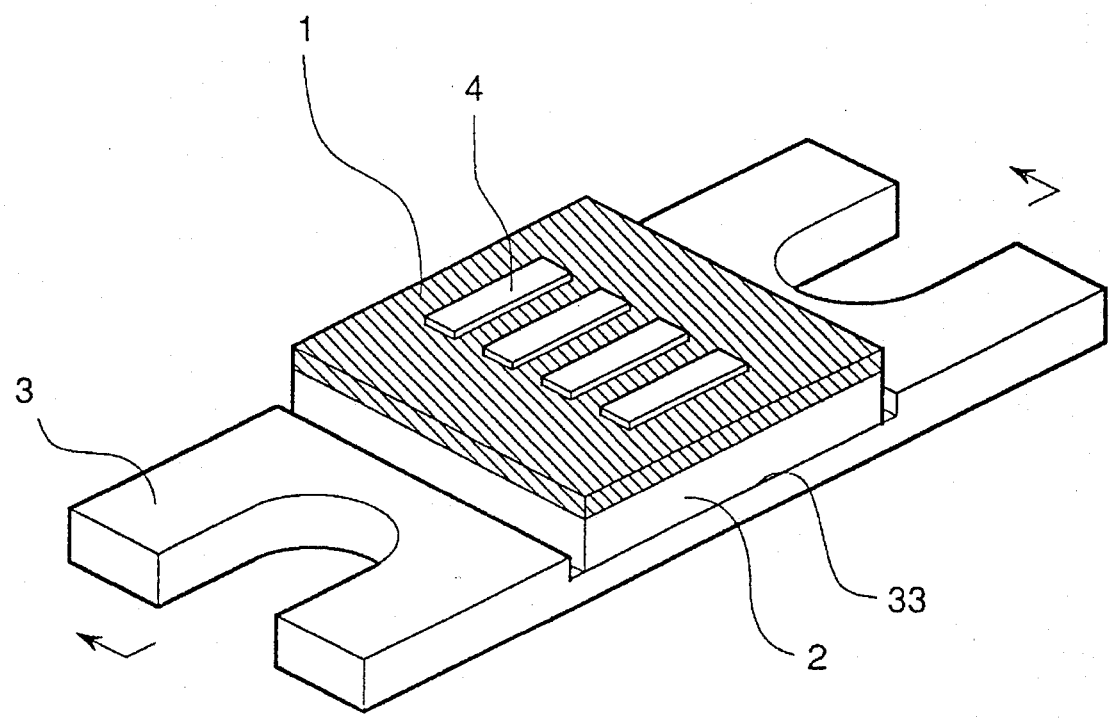
Figure 3B:
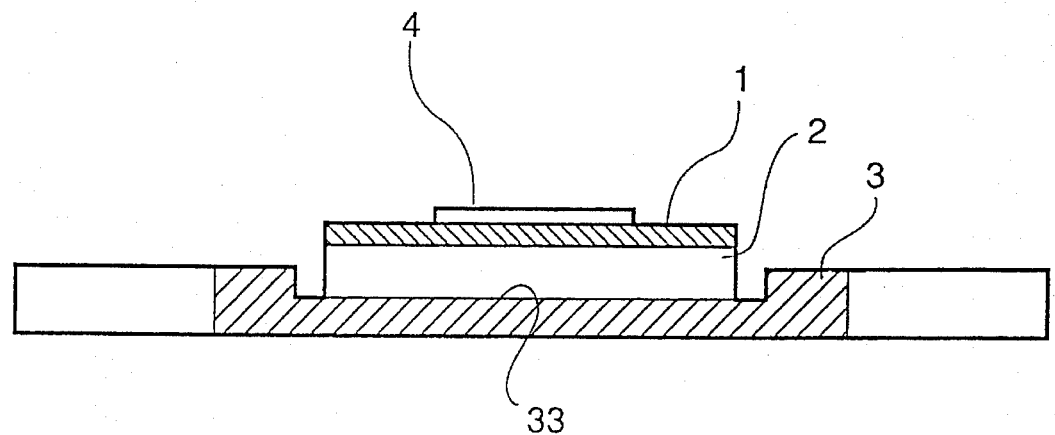

Referring to FIGS. 3A and 3B, a third embodiment of the mounting structure for a semiconductor device in accordance with the present invention will be explained. The mounting structure shown in FIGS. 3A and 3B comprises a base 3 foraged of a copper-tungsten alloy having a thinned portion 33 at its center, a heat sink 2 formed of a copper plate arranged on the thinned portion 33 of the base 3, and a ceramic plate 1 equal to that of FIGS. 1A and 1B disposed on the heat sink 2. Namely, the mounting structure of this embodiment is different from that of FIGS. 1A and 1B in that the base 3 does not have an island portion so that the heat sink 2 is thicker.

In this embodiment, the base 3 has a dimension of 12×28 millimeters. The thinned portion 33 has a thickness of 1.1 millimeters and other portions has a thickness of 1.5 millimeters. The heat sink 2 has a dimension of 10×10 millimeters and a thickness of 0.8 millimeters and the ceramic plate 1 has a dimension of 10×10 millimeters and a thickness of 0.2 millimeters.

Since the heat sink 2 is thicker than that of the mounting structure shown in FIGS. 1A and 1B, the mounting structure shown in FIGS. 3A and 3B has lower thermal resistance.

Figure 4A:
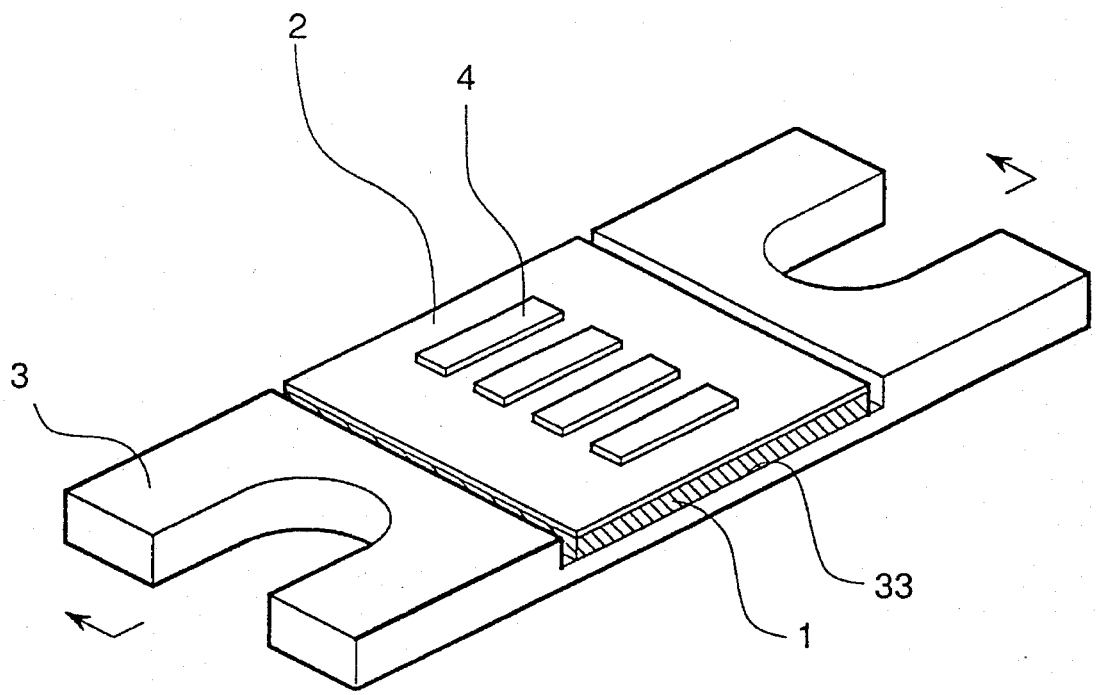
Figure 4B:
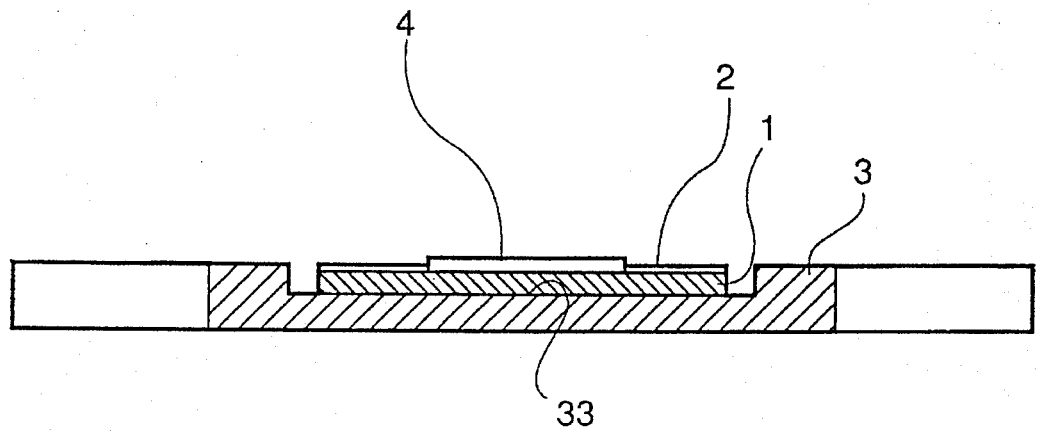

Referring to FIGS. 4A and 4B, a fourth embodiment of the mounting structure for a semiconductor device in accordance with the present invention will be explained. The mounting structure shown in FIGS. 4A and 4B comprises a base 3 equal to that of FIGS. 3A and 3B, a ceramic plate 1 equal to that of FIGS. 1A and 1B disposed on the thinned portion 33 of the base 3, and a heat sink 2 formed of a copper plate covering the ceramic plate 1 excluding semiconductor devices 4. Namely, the mounting structure of this embodiment: is different from that of FIGS. 3A and 3B in that the heat sink 2 is arranged on an upper surface of the ceramic plate I on which the semiconductor devices 4 are mounted instead of between the ceramic plate 1 and base 3.

In this embodiment, the ceramic plate 1 has a dimension of 10×10 millimeters and a thickness of 0.4 millimeters and the heat sink 2 has a dimension of 10×10 millimeters and a thickness of 0.2 millimeters. The heat sink 2 has openings through which the semiconductor devices 4 are exposed.

As easily understood from the FIGS. 4A and 4B, the mounting structure shown in FIGS. 4A and 4B has a lower height. Since the heat sink 2 is arranged on the upper surface the ceramic plate 1 on which the semiconductor devices 4 are mounted, the mounting structure shown in FIGS. 4A and 4B has enough low thermal resistance in spite of its low height.

Figure 5A:
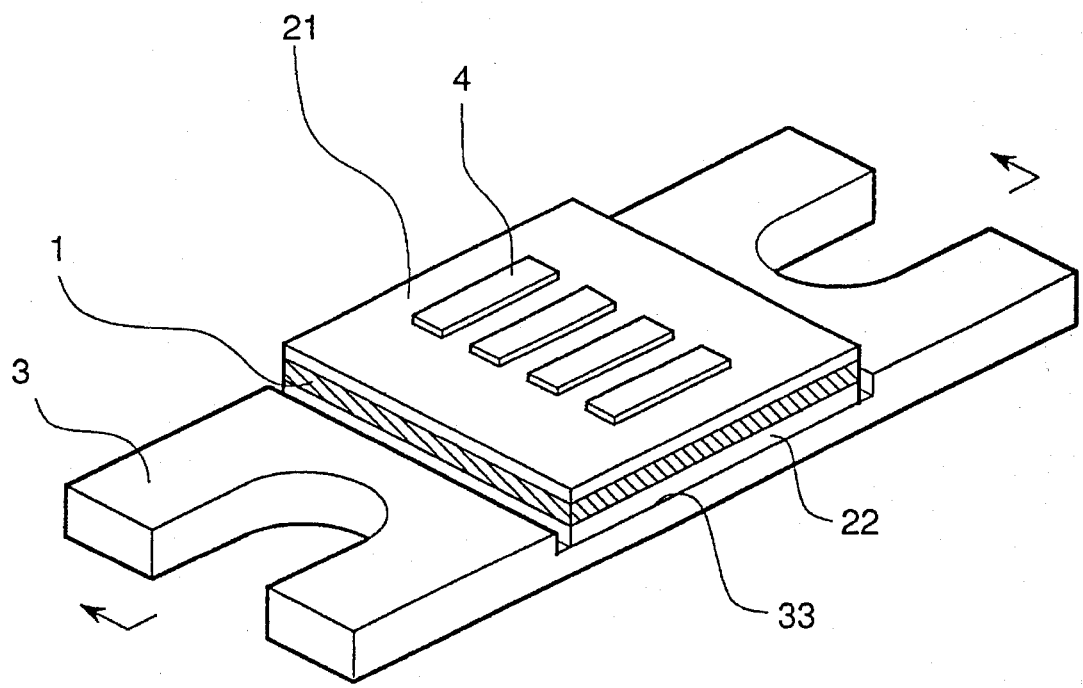
Figure 5B:
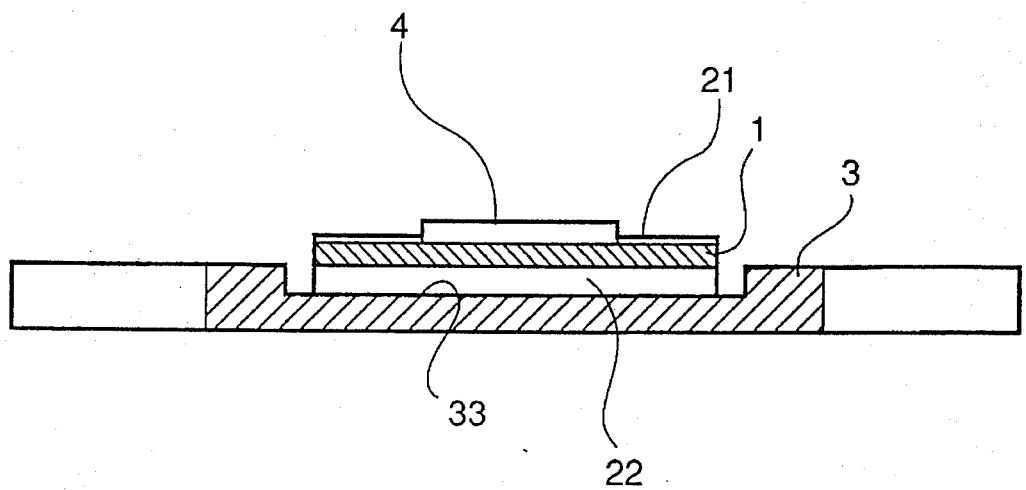

Referring to FIGS. 5A and 5B, a fifth embodiment of the mounting structure for a semiconductor device in accordance with the present invention will be explained. The mounting structure shown in FIGS. 5A and 5B comprises a base 3 formed of a copper-tungsten alloy having a thinned portion 33 at its center like that of the mounting structure shown in FIGS. 3A and 3B, a lower heat sink 22 formed of a copper plate arranged on the thinned portion 33 of the base 3, a ceramic plate 1 equal to that of FIGS. 1A and 1B disposed on the heat sink 2, and an upper heat sink 21 formed of a copper plate covering the ceramic plate 1 excluding semiconductor devices 4. Namely, the mounting structure of this embodiment is different from that of FIGS. 3A and 3B in that heat sinks are arranged both on and under the ceramic plate 1.

In this embodiment, the base 3 has a dimension of 12×28 millimeters. The thinned portion 33 has a thickness of 1.3 millimeters and other portions has a thickness of 1.5 millimeters. The lower heat sink 22 has a dimension of 10×10 millimeters and a thickness of 0.4 millimeters and the upper heat sink 21 also has a dimension of 10×10 millimeters and a thickness of 0.2 millimeters. The ceramic plate 1 has a dimension of 10×10 millimeters and a thickness of 0.2 millimeters.

Since the mounting structure shown in FIGS. 5A and 5B comprises the upper and lower heat sinks 221 and 22, it has lower thermal resistance than that of FIGS. 3A and 3B.

Figure 6A:
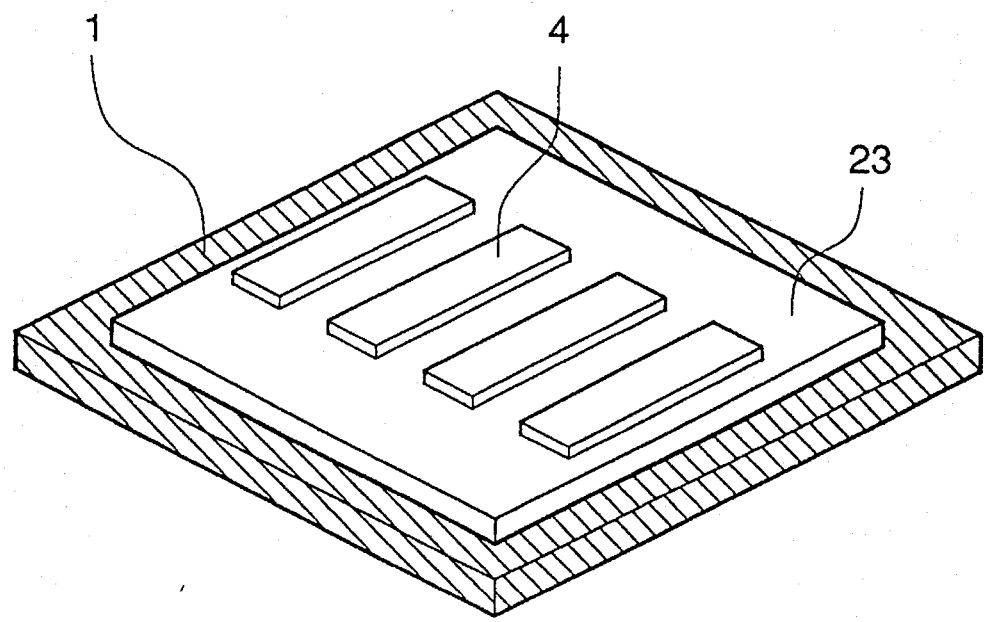
FIGS. 6A and 6B are perspective views illustrating variations of upper heat sinks of the mounting structure in accordance with the present invention.
Figure 6B:
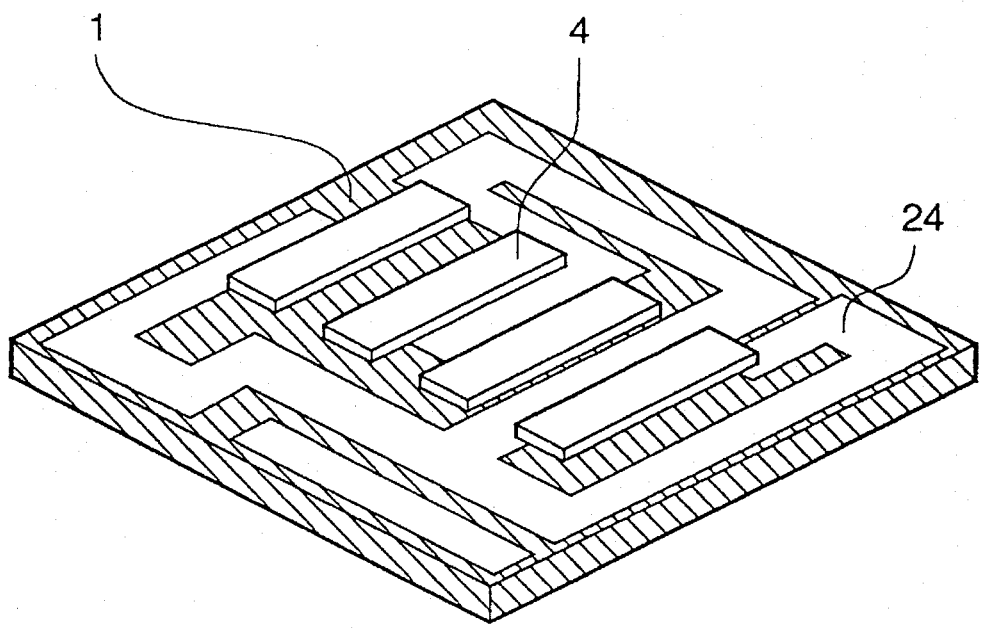

In the mounting structure shown in FIGS. 5A and 5B, thermal resistance is considerably lowered only by the lower heat sink. Therefore, the upper heal sink does not need to completely cover the upper surface of the ceramic plate 1. There are shown variations of the upper heat sink of this mounting structure in FIGS. 6A and 6B. FIGS. 6A and 6B are perspective views of ceramic plate I on which different type of the upper heat sinks are arranged.

In FIG. 6A, an upper sink 23 only covers a portion of the upper surface of the ceramic plate 1 near the semiconductor devices 4. Namely, the upper sink is arranged at a portion which is heated to high temperatures. The upper surface of the ceramic plate 1 is disposed at the edges. This arrangement is favorable in that terminals or electrodes can be disposed on the edges of the upper surface of the ceramic plate 1 in addition to further lower thermal resistance of the mounting structure.

In FIG. 6B, an upper sink 24 also forms a circuit for the semiconductor devices 4. In this case, each wiring of the circuit preferably has a larger width relative to its current capability so as to increase the surface area of the circuit through which heat dissipates.

Figure 7A:
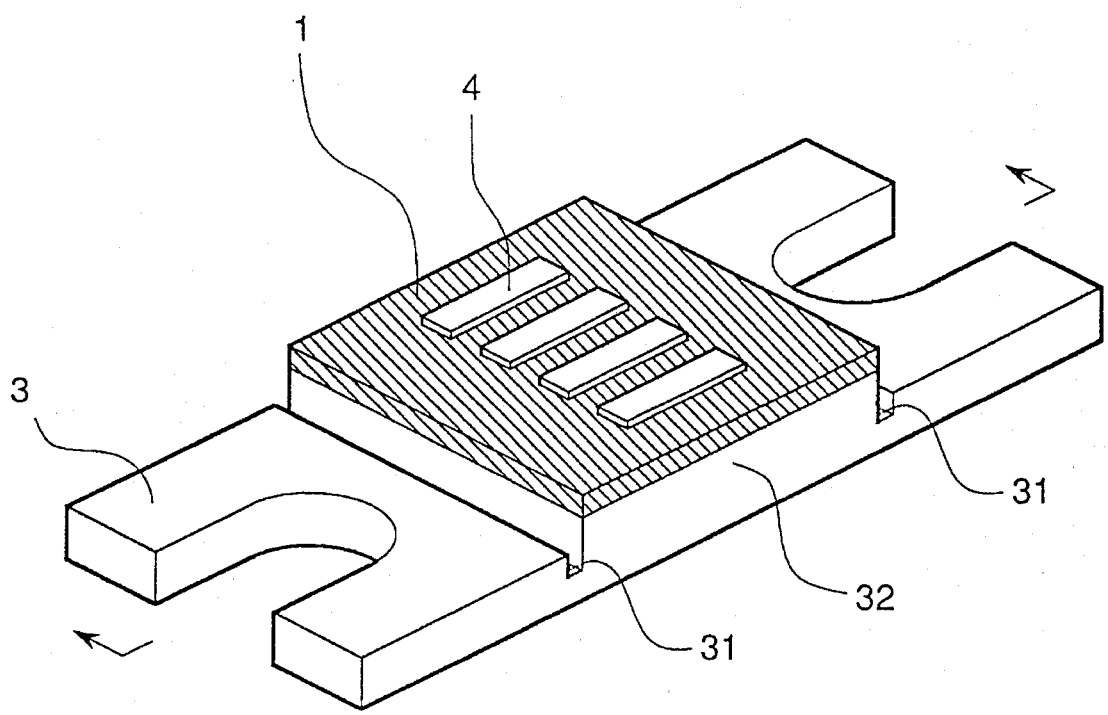
Figure 7B:
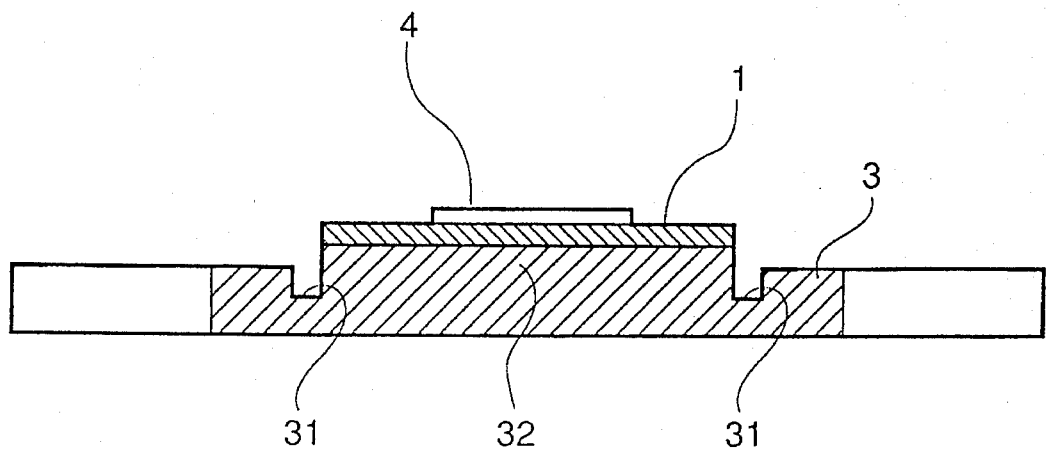

Referring to FIGS. 7A and 7B, a sixth embodiment of the mounting structure for a semiconductor device in accordance with the present invention will be explained. The mounting structure shown in FIGS. 7A and 7B comprises a base 3 formed of copper having two grooves 31 and a rectangle or a square thick island portion 32 at a center of the base 3 and a ceramic plate 1 equal to that of FIGS. 1A and 1B disposed on the island portion 32. Namely, the mounting structure of this embodiment is different from that of FIGS. 1A and 1B in that the heat sink 2 of FIGS. 1A and 1B is integrated into or combined with the base 3 in one piece.

In this embodiment, the base 3 should be formed of copper or a copper based alloy having a thermal conductivity equal to or higher than 300 W/mK. Otherwise, the mounting structure can not have enough low thermal resistance.

The base 3 has a dimension of 12×28 millimeters. The thick island 32 has a thickness of 1.8 millimeters and other portions a thickness of 1.5 millimeters excluding the groove portions. The ceramic plate 1 has a dimension of 10×10 millimeters and a thickness of 0.2 millimeters.

Since the heat sink is integrated into the base in one piece so that there is no junction between the heat sink and the base, the mounting structure shown in FIGS. 7A and 7B has lower thermal resistance than that of FIGS. 3A and 3B.

In each of above mentioned mounting structures in accordance with the present invention, high calorific semiconductor devices are mounted on a ceramic plate of high thermal conductivity and the ceramic plate is mounted on a heat sink of copper. Additionally, in some cases, another heat sink of copper is arranged on an upper surface of the ceramic plate. Furthermore, the heat sink is mounted on the base having a thermal conductivity equal to or higher than 100 W/mK, or the heat sink is integrated into the base in one piece. Therefore, thermal resistance of the mounting structure in accordance with the present invention is significantly low so that heat generated by the semiconductor devices can efficiently dissipate. This makes it possible to mount semiconductor devices of higher output.

Furthermore, since aluminium nitride can be used for the ceramic plate and the other members are formed of copper or copper alloy, the mounting structure in accordance with the present invention is preferable in its cost.

The above mounting structures can be manufactured by the following process. At first, a aluminium nitride or beryllia ceramic plate of which both surfaces are metalized is prepared. The metalized ceramic plate can be obtained by co-firing process in which metal paste is applied to green sheet and the green sheet is sintered. It can be also obtained by post metalizing process in which metalizing layers are formed on a sintered ceramic plate by thin film technology such as vacuum evaporation or by thick film technology such as screen-printing.

A heat sink of a copper or copper based alloy plate is joined on a metalized surface of the ceramic plate by brazing or the like. If necessary, a heat sink is respectively joined on each metalized surface of the ceramic plate.

Then, the heat sink joined to the ceramic plate is mounted on a base by brazing. If the base is formed of copper or a copper based alloy, the ceramic plate is directly mounted on the base.

Thereafter, semiconductor devices are mounted on the ceramic plate and necessary wirings are performed. An appropriate cap can be attached for protection of the semiconductor device. By this, a package to which the mounting structure in accordance with the present invention is applied is completed.

Thermal resistance of the above embodiments of the mounting structure in accordance with the present invention was evaluated with conventional ones. The results are shown in following Table 1:

TABLE 1

|  | Reference | | Sample | | | | |
|---|---|---|---|---|---|---|---|
|  | 1 | 2 | 1 | 2 | 3 | 4 | 5 |
| Upper heat sink (thickness; mm) | — | — | — | Cu (0.2) | — | Cu (0.2) | — |
| Ceramic plate (thickness; mm) | BeO (0.6) | AlN (0.25) | AlN (0.25) | AlN (0.4) | AlN (0.2) | AlN (0.2) | AlN (0.2) |
| Lower heat sink (thickness; mm) | — | Cu (0.35) | Cu (0.35) | — | Cu (0.8) | Cu (0.4) | — |
| Base (thickness of mounting; mm) | CuW (1.5) | WC—Co* (1.5) | CuW (1.5) | CuW (1.5) | CuW (1.1) | CuW (1.3) | Cu (1.8) |
| Thermal resistance (°C./W) | 4.39 | 7.33 | 4.98 | 3.04 | 2.63 | 2.51 | 1.67 |

Remarks:
*Thermal conductivity of the WC—Co alloy is 100 W/mK.
Sample 1 is shown in FIGS. 1A and 1B, Sample 2 is shown in FIGS. 2A and 2B, Sample 3 is shown FIGS. 3A and 3B, Sample 4 is shown in FIGS. 5A and 5B and Sample 5 is shown in FIGS. 7A and 7B.

As shown in Table 1, the mounting structure utilizing aluminium nitride in accordance with the present invention has thermal resistance almost equal to or lower than that of conventional one utilizing beryllia. Therefore, according to the present invention, there is provided a low-cost mounting structure having a lower thermal resistance so as to apply to a ceramic package for a semiconductor device of high output.

The invention has thus been shown and described with reference to the specific embodiments. However, it should be noted that the present invention is in no way limited to the details of the illustrated structures but changes and modifications may be made within the scope of the appended claims.

We claim:

1. A structure for mounting a semiconductor device comprising:

a ceramic plate having a thermal conductivity equal to or higher than 120 W/mK, one surface of which is designed to mount the semiconductor device;

a heat sink joined to another surface of the ceramic plate, said heat sink formed of a copper or a copper based alloy plate having a thermal conductivity equal to or higher than 300 W/mK; and a base member formed of a copper or a copper based alloy having a thermal conductivity equal to or higher than 100 W/mK on which the heat sink is mounted, wherein the heat sink has a thermal conductivity which is higher than the thermal conductivities of the ceramic plate and the base member.

2. A structure as claimed in claim 1, wherein the mounting structure further comprises a second heat sink formed of a copper or copper based alloy plate having a thermal conductivity equal to or higher than 300 W/mK and joined to the surface of the ceramic plate which is designed to mount the semiconductor device.

3. A structure as claimed in claim 2, wherein the second heat sink covers the surface of the ceramic plate excluding a portion at which the semiconductor device is designed to mount upon.

4. A structure as claimed in claim 2, wherein the second heat sink forms an electric circuit.

5. A structure as claimed in claim 1, wherein the ceramic plate is formed of aluminium nitride or beryllia.

6. A structure as claimed in claim 1, wherein the copper based alloy of the base member is a metal selected from the group consisting of copper, copper-tungsten and copper-molybdenum.

7. A structure for mounting a semiconductor device comprising:

a ceramic plate having a thermal conductivity equal to or higher than 120 W/mK, one surface of which is designed to mount the semiconductor device; and a base member formed of a copper or copper based alloy plate having a thermal conductivity equal to or higher than 300 W/mK and having a thick portion on which the ceramic plate is mounted, wherein the base member has a thermal conductivity which is higher than the thermal conductivity of the ceramic plate and a difference in thickness between the thick portion and another portion of the base member is larger than a thickness of the ceramic plate.

8. A structure for mounting a semiconductor device comprising:

a ceramic plate having a thermal conductivity equal to or higher than 120 W/mK, one surface of which is designed to mount the semiconductor device;

a heat sink joined to the surface of the ceramic plate, said heat sink being formed of a copper or copper based alloy plate having a thermal conductivity equal to or higher than 300 W/mK; and a base member formed of a copper or a copper based alloy having a thermal conductivity equal to or higher than 100 W/mK on which the ceramic plate is mounted, wherein the heat sink has a thermal conductivity which is higher than the thermal conductivities of the ceramic plate and the base member.

9. A structure for mounting a semiconductor device comprising:

a ceramic plate having a thermal conductivity equal to or higher than 120 W/mK;

a heat sink joined to an upper surface of the ceramic plate, said heat sink formed of a copper or copper based alloy plate having a thermal conductivity equal to or higher than 300 W/mK; and a base member formed of copper or a copper based alloy having a thermal conductivity equal to or higher than 100 W/mK on which the ceramic plate is mounted, wherein the heat sink has a thermal conductivity higher than the thermal conductivities of the ceramic plate and the base member.

10. A structure for mounting a semiconductor device comprising:

a ceramic plate having a thermal conductivity equal to or higher than 120 W/mK;

a first heat sink joined to an upper surface of the ceramic plate;

a second heat sink joined to a lower surface of the ceramic plate; and a base member formed of copper or a copper based alloy and having a thermal conductivity equal to or higher than 100 W/mK on which the heat sink is mounted, wherein the first and second heat sinks are respectively formed of a copper or a copper based alloy plate having a thermal conductivity equal to or higher than 300 W/mK and higher than the thermal conductivities of the ceramic plate, and wherein the base member and the second heat sink are each thicker than the ceramic plate.

11. A structure as claimed in claim 1, wherein the heat sink is thicker than the ceraic plate.

* * * * *